(12) United States Patent
Hirano et al.

(10) Patent No.: US 11,990,349 B2
(45) Date of Patent: May 21, 2024

(54) METHOD FOR PRODUCING PACKAGE SUBSTRATE FOR LOADING SEMICONDUCTOR DEVICE

(71) Applicant: MITSUBISHI GAS CHEMICAL COMPANY, INC., Tokyo (JP)

(72) Inventors: Syunsuke Hirano, Yamagata (JP); Yoshihiro Kato, Fukushima (JP); Takaaki Ogashiwa, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 480 days.

(21) Appl. No.: 17/413,355

(22) PCT Filed: Oct. 21, 2019

(86) PCT No.: PCT/JP2019/041308
§ 371 (c)(1),
(2) Date: Jun. 11, 2021

(87) PCT Pub. No.: WO2020/121652
PCT Pub. Date: Jun. 18, 2020

(65) Prior Publication Data
US 2022/0020602 A1    Jan. 20, 2022

(30) Foreign Application Priority Data
Dec. 14, 2018  (JP) ................ 2018-234584

(51) Int. Cl.
*H01L 21/48*  (2006.01)
*C23C 18/16*  (2006.01)
(Continued)

(52) U.S. Cl.
CPC ...... *H01L 21/4857* (2013.01); *C23C 18/1603* (2013.01); *C23C 18/1803* (2013.01);
(Continued)

(58) Field of Classification Search
CPC . C23C 18/1603; C23C 18/1803; C23C 18/38; C25D 3/38; C25D 5/02;
(Continued)

(56) References Cited

U.S. PATENT DOCUMENTS 3,990,926 A * 11/1976 Konicek ................ C25D 5/623
216/36
2007/0124925 A1* 6/2007 Nakamura .......... H01L 21/6835
174/262
(Continued)

FOREIGN PATENT DOCUMENTS

JP    2005-101137 A    4/2005
JP    2007-335700 A    12/2007
(Continued)

OTHER PUBLICATIONS

International Search Report issued in International Patent Application No. PCT/JP2019/041308, dated Dec. 24, 2019, along with English translation thereof.
(Continued)

*Primary Examiner* — Philip C Tucker
*Assistant Examiner* — Brian R Slawski
(74) *Attorney, Agent, or Firm* — GREENBLUM & BERNSTEIN, P.L.C.

(57) ABSTRACT

A method for manufacturing a package substrate including an insulating layer and a wiring conductor, including: forming, on one or both sides of a core resin layer, a substrate including a peelable first metal layer that has a thickness of 1-70 μm, a first insulating resin layer, and a second metal layer; forming a non-through hole reaching a surface of the first metal layer, performing electrolytic and/or electroless copper plating on its inner wall, and connecting the second and first metal layers; arranging a second insulating resin layer and a third metal layer and heating and pressurizing the
(Continued)

first substrate to form a substrate; forming a non-through hole reaching a surface of the second metal layer, performing electrolytic and/or electroless copper plating on its inner wall, and connecting the second and third metal layers; peeling a third substrate; and patterning the first and third metal layers to form the wiring conductor.

6 Claims, 1 Drawing Sheet

(51) Int. Cl.
*C23C 18/18* (2006.01)
*C23C 18/38* (2006.01)
*C25D 3/38* (2006.01)
*C25D 5/02* (2006.01)
*C25D 5/34* (2006.01)
*C25D 7/00* (2006.01)

(52) U.S. Cl.
CPC .............. *C23C 18/38* (2013.01); *C25D 3/38* (2013.01); *C25D 5/02* (2013.01); *C25D 5/34* (2013.01); *C25D 7/00* (2013.01)

(58) Field of Classification Search
CPC ......... C25D 5/34; C25D 7/00; H01L 21/4857; H01L 21/6835; H01L 2221/68345; H01L 23/12; H05K 2203/0156; H05K 2203/1536; H05K 3/0035; H05K 3/0038; H05K 3/0047; H05K 3/007; H05K 3/0097; H05K 3/064; H05K 3/067; H05K 3/429; H05K 3/4655; H05K 3/467; H05K 3/4682
USPC ......... 156/60, 230, 233, 235, 237, 247, 150, 156/151, 289, 308.2, 309.6, 701, 703, 156/714, 719; 427/97.2, 97.7, 99.5; 174/250, 255, 258
See application file for complete search history.

(56) References Cited

U.S. PATENT DOCUMENTS

| | | | |
|---|---|---|---|
| 2007/0289704 A1 | 12/2007 | Takano et al. | |
| 2009/0078451 A1* | 3/2009 | Niki | H05K 3/4682 |
| | | | 174/250 |
| 2010/0096078 A1 | 4/2010 | Nakamura et al. | |
| 2012/0006478 A1* | 1/2012 | Sung | H05K 3/0097 |
| | | | 156/247 |
| 2012/0205039 A1* | 8/2012 | Yamada | H05K 3/4682 |
| | | | 156/247 |
| 2012/0328857 A1* | 12/2012 | Yajima | H05K 1/036 |
| | | | 428/221 |
| 2013/0143062 A1* | 6/2013 | Kaneko | B32B 7/06 |
| | | | 156/247 |
| 2014/0090879 A1* | 4/2014 | Seneviratne | H05K 3/007 |
| | | | 156/247 |
| 2014/0102767 A1* | 4/2014 | Kang | H05K 3/0064 |
| | | | 216/13 |
| 2016/0035661 A1* | 2/2016 | Suzuki | H05K 3/4682 |
| | | | 174/251 |
| 2016/0113120 A1* | 4/2016 | Ishihara | H05K 3/4682 |
| | | | 174/262 |
| 2019/0181000 A1 | 1/2019 | Hirano et al. | |
| 2019/0148169 A1 | 5/2019 | Hirano et al. | |

FOREIGN PATENT DOCUMENTS

| | | |
|---|---|---|
| JP | 2011-119722 A | 6/2011 |
| JP | 2012-099857 A | 5/2012 |
| JP | 2014-220402 A | 11/2014 |
| JP | 2015-159223 A | 9/2015 |
| TW | 201806110 A | 2/2018 |
| WO | 2012/121373 A1 | 9/2012 |
| WO | 2018/003703 A1 | 1/2018 |
| WO | 2018/026004 A1 | 2/2018 |

OTHER PUBLICATIONS

Written Opinion of the International Searching Authority issued in International Patent Application No. PCT/JP2019/041308, dated Dec. 24, 2019, along with English translation thereof.

* cited by examiner

FIG. 1

METHOD FOR PRODUCING PACKAGE SUBSTRATE FOR LOADING SEMICONDUCTOR DEVICE

TECHNICAL FIELD

The present invention relates to a method for manufacturing a package substrate for mounting semiconductor device.

BACKGROUND ART

In recent years, the speed with which semiconductor packages, which are widely used in electronic devices, communication devices, personal computers, and the like, are becoming more highly functional and more compact is becoming faster and faster. Along with this, in semiconductor packages, there is a demand for thinner printed wiring boards and package substrates for loading a semiconductor device. Usually, a printed wiring board and a package substrate for loading a semiconductor device are fabricated by laminating a layer to be a circuit pattern (hereinafter, also simply referred to as a "wiring conductor") and an insulating material on a support substrate.

As a method for producing such a package substrate for loading a semiconductor device, for example, a method has been disclosed in which, using a circuit-forming substrate having a first insulating resin provided on the carrier foil surface of an ultrathin copper foil with a carrier foil, a first wiring conductor is formed by pattern electrolytic copper plating, a second insulating resin is further laminated, and then a second wiring conductor is formed (see, for example, Patent Literature 1 below). Also, as a production technology related to these package substrates for loading a semiconductor device, methods have been disclosed in which a plurality of layers are laminated on a substrate that serves as the core, and after forming a laminate, this laminate is separated from the substrate that serves as the core to fabricate a semiconductor package substrate or the like (see, for example, Patent Literatures 2 to 4 below).

CITATION LIST

Patent Literature

Patent Literature 1: Japanese Patent Laid-Open No. 2005-101137
Patent Literature 2: Japanese Patent Laid-Open No. 2014-220402
Patent Literature 3: Japanese Patent Laid-Open No. 2012-099857
Patent Literature 4: Japanese Patent Laid-Open No. 2011-119722

SUMMARY OF INVENTION

Technical Problem

As the production technology related to package substrates for loading a semiconductor device as mentioned above, an approach has been known in which a copper-clad laminate obtained by arranging a metal foil on both sides of a core resin layer is used as a center, and an insulating layer such as a prepreg and a metal foil are built up on both sides of the copper-clad laminate to form a circuit-forming substrate. The circuit-forming substrate is also referred to as a "four-layer coreless shield plate" when it has four layers of metal foil. For example, a four-layer coreless shield plate is subsequently subjected to a patterning step or the like to become a six-layer coreless shield plate, and each substrate (laminate) provided on both sides of the core resin layer is peeled off.

In addition, in recent years, there has been a growing demand for thinner package substrates for loading a semiconductor device, such as those having a thickness of about 40 μm. As these package substrates become thinner and thinner, matters that were not problems in the past are now becoming apparent as new problems. For example, in the production process of a package substrate, it is necessary to perform hole drilling, desmear treatment, plating step, and the like on the laminate, which is an intermediate product. When the hole drilling is carried out, the stiffness of the laminate is reduced temporarily until the hole is plugged by the plating step or the like. Also, this reduction in stiffness increases the possibility of occurrence of warpage in the laminate. In each step, the laminate needs to be conveyed in order to move on to the next step, but the thinned laminate is in a state of reduced stiffness, which increases the possibility of being damaged and reduces the handling properties. Moreover, as the substrate becomes thinner, in each treatment, the warpage of the substrate (laminate) has a greater influence on each treatment, such as alignment. As described above, as the substrate becomes thinner, the final yield may be reduced based on a variety of causes.

The present invention solves the problems mentioned above, and it is an object of the present invention to provide a method for manufacturing a package substrate for mounting semiconductor device having excellent yield.

Solution to Problem

<1> A method for manufacturing a package substrate for mounting semiconductor device comprising an insulating layer and a wiring conductor provided on the insulating layer, the method comprising:
  a first substrate forming step (a) of forming a first substrate comprising a first metal layer that has a thickness of 1 μm to 70 μm and that is peelable from the core resin layer, a first insulating resin layer, and a second metal layer in this order on one side or both sides of a core resin layer;
  a first interlayer connection step (b) of forming a non-through hole reaching a surface of the first metal layer on a surface of the first substrate, carrying out electrolytic copper plating and/or electroless copper plating on an inner wall of the non-through hole, and connecting the second metal layer and the first metal layer;
  a second substrate forming step (c) of forming a second substrate by heating and pressurizing a laminate formed by arranging a second insulating resin layer and a third metal layer in this order on a surface of the second metal layer of the first substrate;
  a second interlayer connection step (d) of forming a non-through hole reaching the surface of the second metal layer on a surface of the second substrate, carrying out electrolytic copper plating and/or electroless copper plating on an inner wall of the non-through hole, and connecting the second metal layer and the third metal layer;
  a peeling step (e) of peeling off, from the core resin layer, a third substrate comprising the first metal layer, the first insulating resin layer, the second metal layer, the second insulating resin layer, and the third metal layer in this order; and a wiring conductor forming step (f) of patterning the first metal layer and the third metal layer of the third substrate to form the wiring conductor.

<2> The method for manufacturing a package substrate for mounting semiconductor device according to the above <1>, wherein the first substrate forming step (a) is performed by:

(i) arranging the first metal layer on one side or both sides of the core resin layer, heating and pressurizing to laminate, then arranging the first insulating resin layer and the second metal layer in this order on the surface of the first metal layer, and heating and pressurizing to form the first substrate; or (ii) forming a laminate in which the first metal layer, the first insulating resin layer, and the second metal layer are arranged in this order on both sides of the core resin layer, and heating and pressurizing the laminate all at once to form the first substrate.

<3> The method for manufacturing a package substrate for mounting semiconductor device according to the above <1> or <2>, wherein the third substrate has a thickness of 5 μm to 100 μm.

<4> The method for manufacturing a package substrate for mounting semiconductor device according to any of the above <1> to <3>, wherein the first metal layer comprises a peeling layer, and in the first substrate, the first metal layer is arranged such that the peeling layer and the core resin layer are in contact with each other.

<5> The method for manufacturing a package substrate for mounting semiconductor device according to any of the above <1> to <4>, wherein the third metal layer comprises a carrier layer, and the carrier layer is removed from the third metal layer after the first substrate is heated and pressurized in the second substrate forming step (c).

<6> The method for manufacturing a package substrate for mounting semiconductor device according to any of the above <1> to <5>, wherein at least any one of the first metal layer, the second metal layer, and the third metal layer is a copper foil.

<7> The method for manufacturing a package substrate for mounting semiconductor device according to any of the above <1> to <6>, wherein at least any one of the core resin layer, the first insulating resin layer, and the second insulating resin layer is a prepreg obtained by impregnating a base material with a resin.

<8> The method for manufacturing a package substrate for mounting semiconductor device according to any of the above <1> to <7>, wherein the core resin layer has a film thickness of 1 μm to 90 μm.

Advantageous Effects of Invention

According to the present invention, there can be provided a method for manufacturing a package substrate for mounting semiconductor device having excellent yield.

BRIEF DESCRIPTION OF DRAWING

FIGS. 1(A)-(L) are schematic views for illustrating one embodiment of the method for manufacturing a package substrate for mounting semiconductor device of the present invention.

DESCRIPTION OF EMBODIMENT

The present invention will now be described by way of an embodiment as an example. However, the aspect of the present invention is not limited to the embodiment described below.

The method for manufacturing a package substrate for mounting semiconductor device of the present embodiment (hereinafter, sometimes simply referred to as the "production method of the present embodiment") is a method for manufacturing a package substrate for mounting semiconductor device comprising an insulating layer and a wiring conductor provided on the insulating layer, the method comprising:

a first substrate forming step (a) of forming a first substrate comprising a first metal layer that has a thickness of 1 μm to 70 μm and that is peelable from the core resin layer, a first insulating resin layer and a second metal layer in this order on one side or both sides of a core resin layer;

a first interlayer connection step (b) of forming a non-through hole reaching the surface of the first metal layer on the surface of the first substrate, carrying out electrolytic copper plating and/or electroless copper plating on the inner wall of the non-through hole, and connecting the second metal layer and the first metal layer;

a second substrate forming step (c) of forming a second substrate on the surface of the second metal layer of the first substrate by heating and pressurizing a laminate formed by arranging a second insulating resin layer and a third metal layer in this order;

a second interlayer connection step (d) of forming a non-through hole reaching the surface of the second metal layer on the surface of the second substrate, carrying out electrolytic copper plating and/or electroless copper plating on the inner wall of the non-through hole, and connecting the second metal layer and the third metal layer;

a peeling step (e) of peeling off, from the core resin layer, a third substrate comprising the first metal layer, the first insulating resin layer, the second metal layer, the second insulating resin layer, and the third metal layer in this order; and a wiring conductor forming step (f) of patterning the first metal layer and the third metal layer of the third substrate to form the wiring conductor.

In conventional construction methods, in most cases, package substrates for loading a semiconductor device are produced by forming a first substrate, then peeling off a laminate comprising a first metal layer, a first insulating resin layer, a second metal layer, a second insulating resin layer, and a third metal layer from both sides of the substrate that serves as the core, and subsequently carrying out hole drilling, desmear treatment, plating treatment, and the like on the peeled off laminate. However, according to such conventional construction methods, as the substrate becomes thinner, the handling properties of the laminate are reduced and also the warpage of the laminate is likely to occur. As a result, the yield of the final product, the package substrate for loading a semiconductor device, is reduced. These problems, such as reduced handling properties and warpage, often become apparent after the laminate is peeled off from the substrate that serves as the core.

On the other hand, according to the production method of the present embodiment, without peeling off the laminate from the core resin layer after forming the second substrate, the non-through hole is formed in the second substrate and its inner wall is subjected to electrolytic copper plating and/or electroless copper plating, and the second interlayer connection step of connecting the second metal layer and the third metal layer is carried out. Thereafter, the third substrate comprising the first metal layer, the first insulating resin layer, the second metal layer, the second insulating resin layer, and the third metal layer in this order is peeled off from the core resin layer. The third substrate, which is the laminate after being peeled off, is in a state where each layer is already connected to each other, and there is no need to carry out hole drilling or the like that reduces the stiffness for the laminate that has been separated from the core resin layer. Therefore, according to the production method of the present embodiment, the burden imposed on the third substrate after being peeled off is small, and for example, the reduction in handling properties and damage to the substrate caused by the occurrence of warpage due to the reduction in stiffness of the third substrate can be reduced.

The production method of the present embodiment will be described in detail below.

[First Substrate Forming Step (a)]

Figure 1:
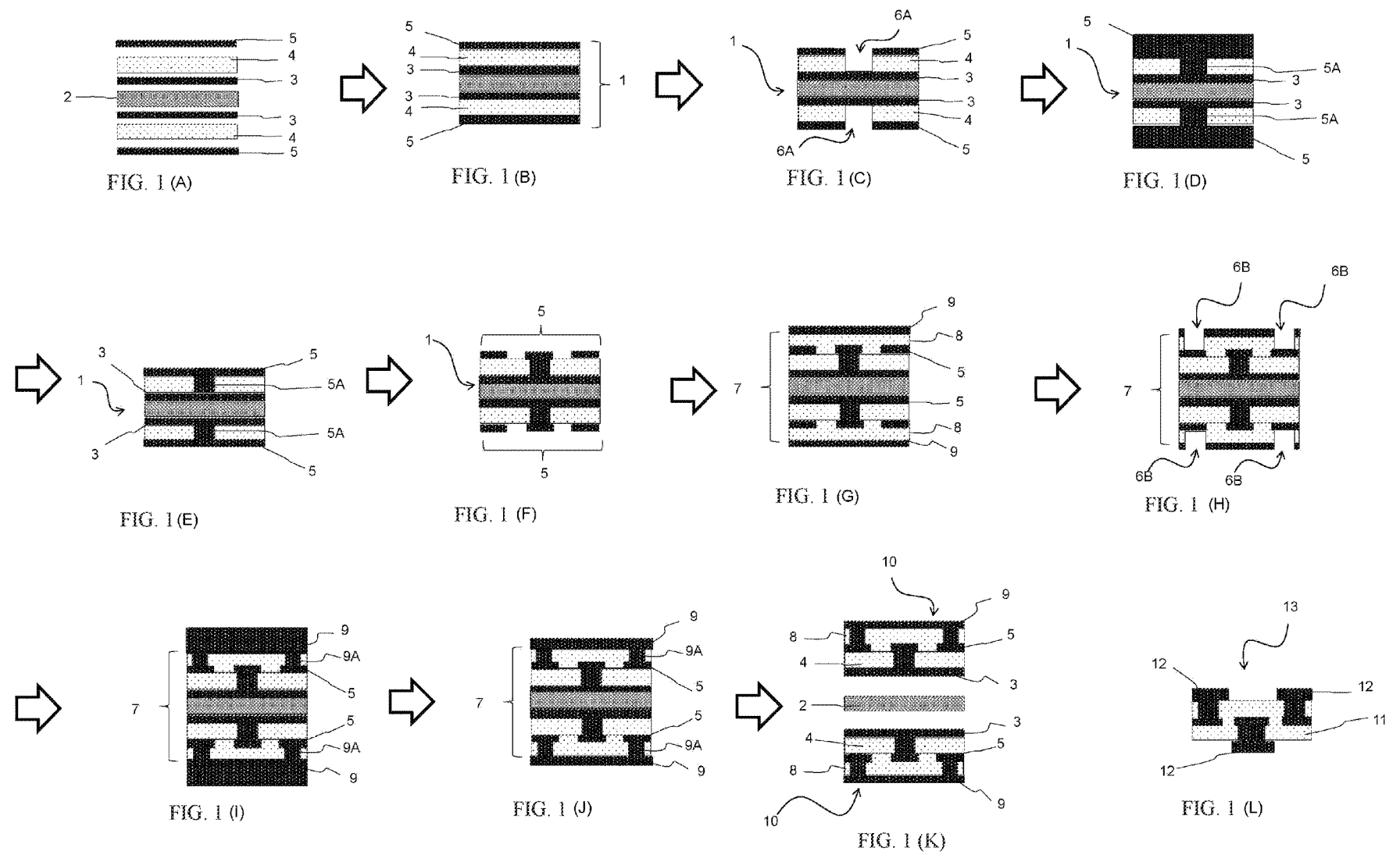

The first substrate forming step (a) is a step of forming a first substrate comprising a first metal layer that has a thickness of 1 µm to 70 µm and that is peelable from the core resin layer, a first insulating resin layer, and a second metal layer in this order on one side or both sides of a core resin layer. The configuration of the first substrate (circuit-forming substrate) will now be described with reference to FIG. 1. FIG. 1 is a schematic view for illustrating one embodiment of the method for manufacturing a package substrate for mounting semiconductor device of the present invention. As illustrated in FIG. 1(A) and FIG. 1(B), a circuit-forming substrate (first substrate) 1 is provided with, in order from a surface side of a core resin layer 2 (for example, a prepreg), a first metal layer 3, a first insulating resin layer 4, and a second metal layer on both sides of the core resin layer 2. Here, the "circuit-forming substrate" is a laminate comprising a core resin layer, a metal foil, and a resin layer, and means a state in which patterning or the like has not been carried out on the metal foil.

In the first substrate forming step (a), the method of forming the first substrate is not particularly limited, but for example, it can be formed by either step of the following (i) or (ii):

(i) arranging the first metal layer on one side or both sides of the core resin layer, heating and pressurizing to laminate, then arranging the first insulating resin layer and the second metal layer in this order on the surface of the first metal layer, and heating and pressurizing to form the first substrate; or (ii) forming a laminate in which the first metal layer, the first insulating resin layer, and the second metal layer are arranged in this order on both sides of the core resin layer, and heating and pressurizing the laminate all at once to form the first substrate.

In the above (i), a pressing step (first pressing) for forming a copper-clad laminate (state in which only the first metal layer is laminated on one side or both sides of the core resin layer) is carried out, and furthermore, another pressing step (second pressing) is carried out after laminating the first insulating resin layer and the second metal layer. The method and conditions upon laminating each layer are not particularly limited, but for example, vacuum pressing can be performed on the laminate under conditions with a temperature of 220±2° C., a pressure of 5±0.2 MPa, and a holding time of 60 minutes. Also, in order to obtain close contact strength between each metal layer and the core resin layer or each insulating resin layer, the surface of each metal layer may be subjected to a roughening treatment. The roughening treatment is not particularly limited, and publicly known means can be used as appropriate. Examples thereof include, for example, means using a copper surface roughening solution.

In the above (ii), a laminate is formed in which the first metal layer, the first insulating resin layer, and the second metal layer are arranged in this order on both sides of the core resin layer, which serves as the center, and then the laminate is heated and pressurized all at once to form the first substrate. Here, "the first substrate (circuit-forming substrate) is formed all at once" means that the first substrate forming step (a) is a step of forming the first substrate (circuit-forming substrate) by arranging the first metal layer, the first insulating resin layer, and the second metal layer in this order on both sides of the core resin layer, which serves as the center, and then heating and pressurizing (carrying out a pressing step on) them, and that the first substrate is formed by carrying out a single pressing step. That is, in (ii), a pressing step for forming a copper-clad laminate is not carried out, and the first substrate is formed by carrying out a single pressing step after the layers up to the first insulating resin layer and the second metal layer have been laminated.

In (ii), the lamination method and conditions for forming the laminate are not particularly limited, but for example, the first substrate can be formed by carrying out vacuum pressing on the laminate under conditions with a temperature of 220±2° C., a pressure of 5±0.2 MPa, and a holding time of 60 minutes. In addition, in order to obtain close contact strength between each metal layer and the core resin layer or each insulating resin layer, the surface of each metal layer may be subjected to a roughening treatment. The above roughening treatment is not particularly limited, and publicly known means can be used as appropriate. Examples thereof include, for example, means using a copper surface roughening solution.

As mentioned above, since one of the pressing steps can be omitted in the case of forming the circuit-forming substrate all at once, the efficiency of producing the circuit-forming substrate and the package substrate for loading a semiconductor device using the circuit-forming substrate can be improved.

(Core Resin Layer)

The core resin layer in the substrate forming step (a) is not particularly limited, but for example, a prepreg, an insulating film material, or the like obtained by impregnating a base material, such as a glass cloth, with an insulating resin material (insulating material), such as a thermosetting resin, can be used.

There is no particular limitation on the thickness of the core resin layer. However, when the first substrate is formed using the construction method of (ii) mentioned above, the thickness of the core resin layer is preferably 1 µm to 90 µm, and is more preferably 1 µm to 80 µm. When the thickness of the core resin layer is 1 µm to 90 µm (preferably, 1 µm to 80 µm), the moldability of the resin is sufficient, and upon forming the first substrate all at once, it is possible to suppress the occurrence of wrinkles and asperities on the metal layer of the third substrate surface peeled off from the core resin layer after the peeling step. Therefore, while improving production efficiency by forming the first substrate (circuit-forming substrate) all at once, the yield of the package substrate for loading a semiconductor device can also be improved since the occurrence of wrinkles and asperities on the metal layer that cause patterning defects is suppressed. The thickness of the core resin layer is still more preferably 3 µm to 40 µm, and particularly preferably 10 µm to 25 µm, from the viewpoint of laminate moldability.

The "prepreg" is obtained by impregnating or coating a base material with an insulating material such as a resin composition.

The base material is not particularly limited, and well known materials used for various electrical insulating material laminates can be used as appropriate. Examples of the material constituting the base material include, for example, inorganic fibers such as E glass, D glass, S glass, and Q glass; organic fibers such as polyimide, polyester, and tetrafluoroethylene; and mixtures thereof. The base material is not particularly limited, but for example, a material having a form such as a woven fabric, a non-woven fabric, a roving, a chopped strand mat, or a surfaced mat can be used as appropriate. The material and form of the base material are selected according to the intended use and performance of the molded product, and a base material of single or two or more kinds of materials and forms can be used, if required.

The thickness of the base material can be set as appropriate depending on the thickness of the core resin layer, and without particular limitations, a base material having a thickness of 10 µm to 30 µm can be usually used. In addition, as the base material, a material that has been subjected to a surface treatment with a silane coupling agent or the like or a material that has been subjected to a mechanical opening treatment can be used, and these base materials are suitable in terms of heat resistance, moisture resistance, and processability.

The insulating material is not particularly limited, and a publicly known resin composition used as an insulating material for a printed wiring board can be selected for use as appropriate. As the resin composition, a thermosetting resin having good heat resistance and chemical resistance can be used as the base. Examples of the thermosetting resin include, but are not particularly limited to, a phenolic resin, an epoxy resin, a cyanate resin, a maleimide resin, an isocyanate resin, a benzocyclobutene resin, and a vinyl resin. The thermosetting resin may be used alone as one kind, or may be used as a mixture of two or more kinds.

Among the thermosetting resins, an epoxy resin can be suitably used as the insulating material because it has excellent heat resistance, chemical resistance, and electrical properties, and it is relatively inexpensive. Examples of the epoxy resin include a bisphenol A-based epoxy resin, a bisphenol F-based epoxy resin, a bisphenol S-based epoxy resin, an alicyclic epoxy resin, an aliphatic chain epoxy resin, a phenol novolac-based epoxy resin, a cresol novolac-based epoxy resin, a bisphenol A novolac-based epoxy resin, a diglycidyl ether of a biphenol, a diglycidyl ether of a naphthalenediol, a diglycidyl ether of a phenol, a diglycidyl ether of an alcohol, and alkyl substituents, halides, hydrogenation products and the like thereof. The epoxy resin may be used alone as one kind, or may be used as a mixture of two or more kinds. Also, the curing agent used together with this epoxy resin can be used with no limitation as long as it cures the epoxy resin. Examples thereof include, for example, a polyfunctional phenol, a polyfunctional alcohol, an amine, an imidazole compound, an acid anhydride, an organic phosphorus compound, and halides thereof. These epoxy resin curing agents may be used alone as one kind, or may be used as a mixture of two or more kinds.

The cyanate resin is a resin that produces a cured product having a triazine ring as a repeating unit by heating, and the cured product has excellent dielectric properties. Therefore, the cyanate resin is suitable particularly when high frequency characteristics are required. Examples of the cyanate resin include, but are not particularly limited to, for example, 2,2-bis(4-cyanatephenyl)propane, bis(4-cyanatephenyl)ethane, 2,2-bis(3,5dimethyl-4-cyanatephenyl)methane, 2,2-(4-cyanatephenyl)-1,1,1,3,3,3-hexafluoropropane, α,α'-bis(4-cyanatephenyl)-m-diisopropylbenzene, and cyanate esterified products of a phenol novolac and an alkylphenol novolac. Among the above, 2,2-bis(4-cyanatephenyl)propane is preferable because it has a particularly good balance between the dielectric properties and curability of the cured product, and is inexpensive in terms of costs. These cyanate resins such as cyanate ester compounds may be used alone as one kind, or may be used as a mixture of two or more kinds. In addition, the above cyanate ester compound may be partially oligomerized in advance into a trimer or a pentamer.

Furthermore, a curing catalyst and a curing accelerator can be used in combination with the cyanate resin. As the curing catalyst, a metal such as manganese, iron, cobalt, nickel, copper, and zinc can be used. Specifically, examples thereof may include an organometallic salt such as 2-ethylhexanate and octylate and an organometallic complex such as an acetylacetone complex. The curing catalyst may be used alone as one kind, or may be used as a mixture of two or more kinds.

Also, it is preferable to use a phenol as the curing accelerator, and a monofunctional phenol such as nonylphenol and paracumylphenol, a bifunctional phenol such as bisphenol A, bisphenol F and bisphenol S, and a polyfunctional phenol such as phenol novolac and cresol novolac, or the like can be used. The curing accelerator may be used alone as one kind, or may be used as a mixture of two or more kinds.

The resin composition used as the insulating material can also be blended with a thermoplastic resin in consideration of dielectric properties, impact resistance, film processability, and the like. Examples of the thermoplastic resin include, but are not particularly limited to, for example, a fluororesin, a polyphenylene ether, a modified polyphenylene ether, a polyphenylene sulfide, a polycarbonate, a polyetherimide, a polyether ether ketone, a polyacrylate, a polyamide, a polyamide-imide, and a polybutadiene. The thermoplastic resin may be used alone as one kind, or may be used as a mixture of two or more kinds.

Among the thermoplastic resin, from the viewpoint of enabling the dielectric properties of the cured product to be improved, it is useful to use a blend of a polyphenylene ether and a modified polyphenylene ether. Examples of the polyphenylene ether and the modified polyphenylene ether include, for example, a poly(2,6-dimethyl-1,4-phenylene) ether, an alloyed polymer of a poly(2,6-dimethyl-1,4-phenylene) ether and a polystyrene, an alloyed polymer of a poly(2,6-dimethyl-1,4-phenylene) ether and a styrene-butadiene copolymer, an alloyed polymer of a poly(2,6-dimethyl-1,4-phenylene) ether and a styrene-maleate anhydride copolymer, an alloyed polymer of a poly(3,6-dimethyl-1,4-phenylene) ether and a polyamide, and an alloyed polymer of a poly(2,6-dimethyl-1,4-phenylene) ether and a styrene-butadiene-acrylonitrile copolymer. Also, in order to impart reactivity and polymerizability to the polyphenylene ether, a functional group such as an amine group, an epoxy group, a carboxylic group, or a styryl group may be introduced at an end of the polymer chain, or a functional group such as an amine group, an epoxy group, a carboxyl group, a styryl group, or a methacrylic group may be introduced into a side chain of the polymer chain.

Among the thermoplastic resin, a polyamide-imide resin is useful from the viewpoint of excellent moisture resistance and the adhesive agent adhering even better to the metal. The raw materials of the polyamide-imide resin are not particularly limited, but examples of the acidic component include trimellitic anhydride and trimellitic anhydride monochloride, and examples of the amine component include metaphenylenediamine, paraphenylenediamine, 4,4'-diaminodiphenyl ether, 4,4'-diaminodiphenylmethane, bis[4-(aminophenoxy)phenyl]sulfone, and 2,2'-bis[4-(4-aminophenoxy)phenyl]propane. The polyamide-imide resin may be modified with siloxane in order to improve a drying property, and in this case, siloxane diamine can be used as the amine component. Considering film processability, it is preferable to use a polyamide-imide resin having a molecular weight of 50,000 or more.

The thermoplastic resins mentioned above have been described as an insulating material mainly used for a prepreg, but these thermoplastic resins are not limited to use as a prepreg. For example, a product (film material) obtained by processing the thermoplastic resin mentioned above into a film may be used as the core resin layer in the circuit-forming substrate described above.

An inorganic filler may be mixed into the resin composition used as the insulating material. Examples of the inorganic filler include, but are not particularly limited to, alumina, aluminum hydroxide, magnesium hydroxide, clay, talc, antimony trioxide, antimony pentoxide, zinc oxide, fused silica, glass powder, quartz powder, and silas balloon. These inorganic fillers may be used alone as one kind, or may be used as a mixture of two or more kinds.

The resin composition used as the insulating material may contain an organic solvent. The organic solvent is not particularly limited, and solvents such as: an aromatic hydrocarbon solvent such as benzene, toluene, xylene, and trimethylbenzene; a ketone solvent such as acetone, methyl ethyl ketone, and methyl isobutyl ketone; an ether solvent such as tetrahydrofuran; an alcohol solvent such as isopropanol and butanol; an ether alcohol solvent such as 2-methoxyethanol and 2-butoxyethanol; an amide solvent such as N-methylpyrrolidone, N,N-dimethylformamide, and N,N-dimethylacetamide, and the like can be used in combination as desired. Note that the amount of solvent in the varnish in the case of fabricating the prepreg is preferably in the range of 40 to 80% by mass with respect to the whole resin composition. Also, the viscosity of the varnish is desirably in the range of 20 to 100 cP (20 to 100 mPa·s).

The resin composition used as the insulating material may contain a flame retardant. The flame retardant is not particularly limited, and publicly known and customary flame retardants can be used, for example, a bromine compound such as decabromodiphenyl ether, tetrabromobisphenol A, tetrabromophthalic anhydride, and tribromophenol; a phosphorous compound such as triphenyl phosphate, trixyly phosphate, and cresyldiphenyl phosphate; a metal hydroxide such as magnesium hydroxide and aluminum hydroxide; red phosphorus and a modified product thereof; an antimony compound such as antimony trioxide and antimony pentoxide; a triazine compound such as melamine, cyanuric acid, melamine cyanurate; and the like.

Furthermore, if necessary, various additive agents and fillers, such as the above-mentioned curing agents and the curing accelerator, as well as thermoplastic particles, a colorant, an ultraviolet ray blocking agent, an antioxidant, a reducing agent, and the like can be added to the resin composition used as the insulating material.

In the present embodiment, the prepreg can be obtained as a prepreg in a semi-cured state (B stage state) by, for example, impregnating or coating the base material with the above-mentioned resin composition (including varnish) such that the amount of the resin composition adhered to the base material is 20 to 90% by mass in terms of the resin content in the prepreg after drying, and then heat drying at a temperature of 100 to 200° C. for 1 to 30 minutes. As such a prepreg, for example, the GHPL-830NS series and GHPL-830NSF series (product names) manufactured by Mitsubishi Gas Chemical Company can be used.

(First Metal Layer)

As the first metal layer, a metal foil that has a thickness of 1 μm to 70 μm and that is peelable from the core resin layer is used. When the thickness of the first metal layer is less than 1 μm, the molding of the first to third substrates becomes poor, and when the thickness is greater than 70 μm, the surface becomes poor. The thickness of the first metal layer is, from the viewpoint of forming the circuit, preferably 1 μm to 12 μm, and still more preferably 2 μm to 5 μm.

As will be mentioned later, the third substrate is peeled off from an interface between the core resin layer and the first metal layer in the peeling step. From the viewpoint of preventing pattern failure, the surface roughness (average roughness (Rzjis) of 10 points shown in JISB0601: 2001) of the first metal layer upon being peeled off from the core resin layer in the peeling step is preferably 1 μm to 3 μm, still more preferably 1 μm to 2 μm, and particularly preferably 1 μm to 1.5 μm. The surface roughness of the first metal layer can be measured by, for example, cutting the sample into a size of 5×5 cm and then measuring a range of 1×1 cm with a VR-3100 microscope (manufactured by Keyence).

As the first metal layer, for example, a copper foil can be used. In addition, as the copper foil, for example, a peelable type can be used. The "peelable type" copper foil is an ultrathin copper foil having a peeling layer. The peeling layer is, for example, a copper foil that can be peeled off. When a peelable type copper foil is used, the first metal layer is laminated such that the peeling layer is in contact with the core resin layer.

Examples of the peeling layer include, for example, a layer containing at least a silicon compound. The peeling layer can be formed by, for example, applying a silicon compound composed of a single silane compound or a plurality of silane compounds on a copper foil or an ultrathin copper foil. Note that the means for applying the silicon compound are not particularly limited, and for example, a publicly known means such as coating can be used. A rust preventive treatment (to form a rust preventive treatment layer) can be carried out on the adhesive surface of the copper foil with the peeling layer. The rust preventive treatment can be carried out using any of nickel, tin, zinc, chromium, molybdenum, and cobalt, or an alloy thereof.

The layer thickness of the peeling layer is not particularly limited, but from the viewpoint of removability and peelability, it is preferably 5 nm to 100 nm, still more preferably 10 nm to 80 nm, and particularly preferably 20 nm to 60 nm.

(First Insulating Resin Layer)

As the first insulating resin layer, the same material as the above-mentioned core resin layer (for example, prepreg) can be used. Also, the thickness of the first insulating resin layer is not particularly limited because it is appropriately set as desired, but for example, it may be 10 μm to 100 μm, and is preferably 10 μm to 50 μm and still more preferably 10 μm to 30 μm.

(Second Metal Layer)

As the second metal layer, for example, the same material as the above-mentioned first metal layer (for example, copper foil) can be used. The thickness of the second metal layer is not particularly limited because it is appropriately set as desired, but for example, it may be 2 µm to 70 µm, and is preferably 2 µm to 18 µm, and still more preferably 2 µm to 12 µm.

Also, as the second metal layer, for example, an ultrathin copper foil with a carrier can be used. In this case, the second metal layer is arranged such that the copper foil or the like is in contact with the second insulating resin layer, and the carrier is peeled off after the first substrate is formed by heating and pressurizing.

[First Interlayer Connection Step (b)]

The first interlayer connection step (b) is a step of forming, on the surface of the above-mentioned first substrate, a non-through hole reaching the surface of the first metal layer, carrying out electrolytic copper plating and/or electroless copper plating on the inner wall of the non-through hole, and connecting the second metal layer and the first metal layer. By undergoing the first interlayer connection step (b), in the first substrate 1, the first metal layer 3 and the second metal layer 5 are interlayerly connected via a copper plating film 5A, ensuring electrical continuity, as shown in FIG. 1(E).

(Formation of Non-Through Hole)

In the first interlayer connection step (b), non-through holes reaching the surface of the first metal layer are formed on the surface of the first substrate. As illustrated in FIG. 1(C), a non-through hole(s) 6A is/are provided on both sides of the first substrate 1.

The means for forming the non-through hole is not particularly limited, and for example, publicly known means such as a laser, for example, a carbon dioxide laser, and a drill can be used. The number and size of non-through holes can be appropriately selected as desired. Also, after forming the non-through hole, a desmear treatment can be carried out using an aqueous solution of sodium permanganate or the like.

(Interlayer Connection)

In the first interlayer connection step (b), after forming the non-through hole 6A, as illustrated in FIG. 1(D), the copper plating film 5A is formed on the inner wall of the non-through hole by carrying out electrolytic copper plating and/or electroless copper plating, and the first metal layer 3 and the second metal layer 5 are electrically connected. At this time, the thickness of the second metal layer on both sides of the first substrate may be increased by the electrolytic copper plating and/or electroless copper plating, and the layer thickness may be adjusted by film thickness adjustment, which will be mentioned later. The method for carrying out the electrolytic copper plating and/or electroless plating is not particularly limited, and publicly known methods can be employed. The copper plating may be either one of electrolytic copper plating or electroless plating only, but it is preferable to carry out both electrolytic copper plating and electroless plating.

(Film Thickness Adjustment)

In the first interlayer connection step (b), as illustrated in FIG. 1(E), after the electrolytic/electroless copper plating treatment, the film thickness of the second metal layer 5 can be adjusted by carrying out a publicly known treatment such as an etching treatment such that it has a desired thickness, if required.

The thickness of the second metal layer after the adjustment is not particularly limited because it is appropriately set as desired, but for example, it may be 2 µm to 30 µm, and is preferably 2 µm to 20 µm, and still more preferably 2 µm to 12 µm.

(Patterning)

In the first interlayer connection step (b), a pattern can be formed on the second metal layer 5 of the first substrate 1, as illustrated in FIG. 1(F), after carrying out surface conditioning for the second metal layer 5, if required. The means for forming a pattern on the second metal layer is not particularly limited, but the pattern can be formed by, for example, the following steps.

The patterning is not particularly limited, but can be performed by, for example, carrying out surface conditioning for the second metal layer, laminating a dry film resist or the like, further attaching a negative mask, then printing the circuit pattern with an exposure machine, and developing the dry film resist with a developing solution to form an etching resist. After that, by performing an etching treatment to remove the copper in the portion without the etching resist with an aqueous solution of ferric chloride and the like, and then removing the resist, a pattern can be formed on the second metal layer.

The above-mentioned resist is not particularly limited, and for example, publicly known resists, such as commercially available dry film resists, can be selected for use as appropriate. Also, the photolithography (including exposure, development, and removal of the resist) upon forming a pattern on the second metal layer is not particularly limited, and can be carried out using publicly known means and equipment.

The pattern width of the second metal layer is not particularly limited, and the width can be selected as appropriate depending on the intended use. For example, the width can be set to 5 to 100 µm, and preferably 10 to 30 µm.

[Second Substrate Forming Step (c)]

The second substrate forming step (c) is a step of forming a second substrate on the surface of the second metal layer of the first substrate by heating and pressurizing a laminate formed by arranging a second insulating resin layer and a third metal layer in this order. By undergoing the second substrate forming step (c), on the second metal layer 5, a second substrate 7 can be obtained in which a second insulating resin layer 8 and a third metal layer 9 are laminated, as illustrated in FIG. 1(G).

(Second Insulating Resin Layer)

As the second insulating resin layer, the same material as the above-mentioned core resin layer (for example, prepreg) can be used. Also, the thickness of the second insulating resin layer is not particularly limited because it is appropriately set as desired, but for example, it may be 10 µm to 100 µm, and is preferably 10 µm to 50 µm and still more preferably 10 µm to 30 µm.

(Third Metal Layer)

As the third metal layer, for example, the same material as the above-mentioned first metal layer (for example, copper foil) can be used. The thickness of the third metal layer is not particularly limited because it is appropriately set as desired, but for example, it may be 2 µm to 70 µm, and is preferably 2 µm to 18 µm, and still more preferably 2 µm to 5 µm.

Also, as the third metal layer, for example, an ultrathin copper foil with a carrier can be used. In this case, the third metal layer is arranged such that the copper foil or the like is in contact with the second insulating resin layer, and the carrier is peeled off after the second substrate is formed by heating and pressurizing.

(Lamination Method/Conditions)

The method and conditions for laminating the second insulating resin layer and the third metal layer in order to obtain the second substrate are not particularly limited, but for example, the second substrate can be formed by laminating the second insulating resin layer and the third metal layer on the first substrate, and then carrying out vacuum pressing under conditions with a temperature of 220±2° C., a pressure of 5±0.2 MPa, and a holding time of 60 minutes. In addition, in order to obtain close contact strength between the second metal layer and the second insulating resin layer, the surface of the second metal layer may be subjected to a roughening treatment.

[Second Interlayer Connection Step (d)]

The second interlayer connection step (d) is a step of forming, on the surface of the second substrate, a non-through hole reaching the surface of the second metal layer, carrying out electrolytic copper plating and/or electroless copper plating on the inner wall of the non-through hole, and connecting the second metal layer and the third metal layer. By undergoing the second interlayer connection step (d), in the second substrate 7, the second metal layer 5 and the third metal layer 9 are interlayerly connected via a copper plating film 9A, ensuring electrical continuity, as shown in FIG. 1(J).

(Formation of Non-Through Hole)

In the second interlayer connection step (d), a non-through hole reaching the surface of the second metal layer is formed on the surface of the second substrate. As illustrated in FIG. 1(H), a non-through hole 6B is provided on both sides of the second substrate 7.

The means for forming the non-through hole is not particularly limited as mentioned above, and for example, publicly known means such as a laser, for example, a carbon dioxide laser, and a drill can be used. The number and size of non-through holes can be appropriately selected as desired. Also, after forming the non-through hole, a desmear treatment can be carried out using an aqueous solution of sodium permanganate or the like.

(Interlayer Connection)

In the second interlayer connection step (d), after forming the non-through hole 6B, as illustrated in FIG. 1(I), the copper plating film 9A is formed on the inner wall of the non-through hole by carrying out electrolytic copper plating and/or electroless copper plating, and the second metal layer 5 and the third metal layer 9 are electrically connected. At this time, the thickness of the third metal layer on both sides of the second substrate may be increased by the electrolytic copper plating and/or electroless copper plating, and the film thickness may be adjusted by film thickness adjustment, which will be mentioned later. The method for carrying out the electrolytic copper plating and/or electroless plating is not particularly limited, and publicly known methods can be employed. The copper plating may be either one of electrolytic copper plating or electroless plating only, but it is preferable to carry out both electrolytic copper plating and electroless plating.

(Film Thickness Adjustment)

In the second interlayer connection step (d), as illustrated in FIG. 1(J), after the electrolytic/electroless copper plating treatment, the film thickness of the third metal layer 9 can be adjusted by carrying out a publicly known treatment such as an etching treatment such that it has a desired thickness, if required.

The thickness of the third metal layer after the adjustment is not particularly limited because it is appropriately set as desired, but for example, it may be 2 μm to 30 μm, and is preferably 2 μm to 20 μm, and still more preferably 2 μm to 12 μm.

[Peeling Step (e)]

The peeling step (e) is a step of peeling off, from the core resin layer, a third substrate comprising the first metal layer, the first insulating resin layer, the second metal layer, the second insulating resin layer, and the third metal layer in this order. After undergoing the peeling step (e), as illustrated in FIG. 1(K), the second substrate 7 is separated at the interface between the core resin layer 2 and the first metal layer 3 arranged on both sides thereof. As a result, two third substrates 10 can be obtained comprising the first metal layer 3, the first insulating resin layer 4, the second metal layer 5, the second insulating resin layer 8, and the third metal layer 9 in this order.

The thickness of the third substrate is not particularly limited because it is appropriately set as desired, but for example, it may be 5 μm to 400 μm, and is preferably 5 μm to 200 μm, and still more preferably 5 μm to 100 μm.

In the peeling step (e), it is preferable that the core resin layer should be peeled off at the interface between the core resin layer and the first metal layer. However, for example, when the first metal layer has a peeling layer, a part of the peeling layer may be peeled off together with the core resin layer. Also included is an aspect in which, at the interface between the peeling layer of the first metal layer and the copper foil, the core resin layer is peeled off together with the peeling layer. When the peeling layer remains on the first metal layer, the peeling layer can be removed by using, for example, a sulfuric acid-based or hydrogen peroxide-based etching solution. The sulfuric acid-based or hydrogen peroxide-based etching solution is not particularly limited, and solutions that are used in the art can be used.

[Wiring Conductor Forming Step (f)]

The wiring conductor forming step (f) is a step of patterning the first metal layer and the third metal layer of the third substrate to form the wiring conductor. By undergoing the wiring conductor forming step (f), as illustrated in FIG. 1(L), a package substrate for loading a semiconductor device 13 can be obtained in which a wiring conductor 12 is formed on both sides of an insulating layer 11. Note that the insulating layer 11 is constituted with the first insulating resin layer 4 and the second insulating resin layer 8, and the wiring conductor 12 is formed by interlayerly connecting each of the patterned first metal layer 3, second metal layer 5, and third metal layer 9 by electrolytic copper plating and/or electroless copper plating.

(Patterning)

The wiring conductor forming step (f) can be performed by carrying out surface conditioning for the first metal layer 3 and the third metal layer 9 (see FIG. 1(K)) if required, then laminating a dry film resist or the like, further attaching a negative mask, then printing the circuit pattern with an exposure machine, and developing the dry film resist with a developing solution to form an etching resist. After that, by performing an etching treatment to remove the copper in the portion without the etching resist with an aqueous solution of ferric chloride and the like, and then removing the resist, the wiring conductor 12 can be formed on both sides of the insulating layer 11.

Other examples of the method for interlayer connection that can be applied in the present embodiment include a method in which a blind via portion formed by a publicly known laser is chemically plated with copper (method in which a wiring circuit is formed by laser processing, then patterned by chemical copper plating to carry out interlayer connection), a method in which the entire insulating layer is pierced by a metal bump (preferably a copper bump) formed by plating or etching a metal foil onto a connecting portion in advance to carry out interlayer connection, as well as a method in which a bump consisting of a metal paste containing a metal filler such as solder, silver, and copper in an insulating resin is printed onto a predetermined location by screen printing or the like, then the paste is cured by drying, and heating and pressurizing are carried out to ensure electrical continuity between the inner and outer layers.

In FIG. 1, in which the present embodiment is exemplified, the package substrate for loading a semiconductor device 13 is a package substrate for loading a semiconductor device having a three-layer structure, but the present invention is not limited thereto, and a package substrate for loading a semiconductor device having an even more built-up structure, such as a five-layer structure, can also be formed. For example, in the wiring conductor forming step (f), after forming the wiring conductor, it is possible to further laminate an insulating resin layer and a metal layer, and repeat the patterning and interlayer connection to obtain a package substrate for loading a semiconductor device that has a built-up structure.

<<Method for Producing a Package Substrate for Loading a Semiconductor Device>>

In the method for manufacturing a package substrate for mounting semiconductor device of the present embodiment, after forming the package substrate for loading a semiconductor device as mentioned above, a semiconductor device such as a bare chip can be loaded as desired.

The semiconductor device is not particularly limited, and a desired semiconductor device can be used as appropriate. For example, a bare chip or the like on which a gold bump has been formed on an aluminum electrode portion by a ball bonding method of a gold wire can be used. The semiconductor device can be loaded via a bonding material onto the wiring conductor of the package substrate for loading a semiconductor device. The bonding material is not particularly limited as long as it has conducive means, but for example, solder or the like (for example, solder balls, solder paste, or the like) can be used. Furthermore, the semiconductor device can be loaded via the bonding material after performing a surface treatment on the wiring conductor of the package substrate for loading a semiconductor device. The surface treatment is not particularly limited, and examples thereof include formation of a nickel layer or a gold plating layer. When solder is used as the bonding material, a treatment such as reflow can be carried out after the semiconductor device is loaded on the wiring conductor. At this time, the reflow temperature is selected as appropriate depending on the melting point of the bonding material and the like, and it can be, for example, 260° C. or higher.

Note that, in the above, the case in which each layer is provided on both sides of the core resin layer was taken as an example and described. However, the present invention is not limited to this case, and each layer may be provided on only one side of the core resin layer.

EXAMPLES

The production method of the present invention will now be specifically described with reference to Examples below.

Example 1

A copper foil with a peeling layer (first metal layer 3 in FIG. 1(A), trade name: PCS, manufactured by JX Nippon Mining & Metals Corporation) obtained by coating a release layer on a 8 μm-thick copper foil was arranged on both sides of a B stage prepreg (core resin layer 2 in FIG. 1(A); thickness 0.100 mm; trade name: GHPL-830NS ST56, manufactured by Mitsubishi Gas Chemical Company) obtained by impregnating a glass cloth (glass fiber) with a bismaleimide triazine resin (BT resin) such that the peeling layer surface adhered to the prepreg. Then, vacuum pressing was carried out under conditions with a temperature of 220±2° C., a pressure of 5±0.2 MPa, and a holding time of 60 minutes, thereby fabricating a copper-clad laminate with a surface roughness of 3 μm copper foil.

<First Substrate Forming Step (a)>

On both sides of the obtained copper-clad laminate, via a B stage prepreg (first insulating resin layer 4 in FIG. 1(A); thickness 0.017 mm; trade name: GHPL-830NS SF62, manufactured by Mitsubishi Gas Chemical Company) obtained by impregnating a glass cloth (glass fiber) with a bismaleimide triazine resin (BT resin), a 2 μm copper foil with an 18 μm carrier copper foil (second metal layer 5 in FIG. 1(A); trade name: MTEx, manufactured by Mitsui Mining & Smelting Co., Ltd.) was laminated by vacuum pressing under conditions with a pressure of 2.5±0.2 MPa, a temperature of 220±2° C., and a holding time of 60 minutes. Then, the 18 μm carrier copper foil was peeled off, thereby fabricating a first substrate (circuit-forming substrate (first substrate) 1 in FIG. 1(B)).

<First Interlayer Connection Step (b)>

Next, holes were individually bored on both sides of the first substrate using a carbon dioxide laser processing machine (trade name: LC-1C/21, manufactured by Hitachi Via Mechanics, Ltd.) under conditions with a beam irradiation diameter of Φ0.21 mm, a frequency of 500 Hz, and a pulse width of 10 μs to form non-through holes (non-through holes 6A in FIG. 1(C)) on both sides of the first substrate. Then, a desmear treatment was carried out using an aqueous solution of sodium permanganate at a temperature of 80±5° C. and a concentration of 55±10 g/L.

Furthermore, a plating treatment to a thickness of 0.4 to 0.8 μm was carried out by electroless copper plating, and then plating to a thickness of 8 μm was carried out by electrolytic copper plating, thereby forming a copper plating film (copper plating film 5A in FIG. 1(D)). As a result, the first and second metal layers were electrically connected by the non-through holes via the copper plating film. Next, surface conditioning for the surface of the first substrate was carried out, and a dry film resist (trade name: NIT225, manufactured by Nichigo-Morton Co., Ltd.) was laminated at a temperature of 110±10° C. and a pressure of 0.50±0.02 MPa. Thereafter, a negative mask was attached thereon, a circuit pattern was then printed with a parallel exposure machine, the dry film resist was developed with an aqueous solution of 1% sodium carbonate to form an etching resist, and the copper in the portion without the etching resist was removed with an aqueous solution of ferric chloride. Then, the dry film resist was removed with an aqueous solution of sodium hydroxide to form a pattern on the second metal layer 5 (see FIG. 1(F)).

<Second Substrate Forming Step (c)>

Next, the surface of the patterned second metal layer was roughened using a copper surface roughening solution (product name: CZ-8100, manufactured by MEC Company Ltd.), and a B stage resin sheet (thickness 0.010 mm; trade name: CRS-381NSI, manufactured by Mitsubishi Gas Chemical Company) obtained by coating a 2 μm copper foil with an 18 μm carrier copper foil (trade name: MTEx, manufactured by Mitsui Mining & Smelting Co., Ltd.) was laminated on the surface of the second metal layer provided on both sides of the first substrate by carrying out vacuum pressing under conditions with a pressure of 2.5±0.2 MPa, a temperature of 220±2° C., and a holding time of 60 minutes. Then, the 18 μm carrier copper foil was peeled off, thereby fabricating a second substrate (second substrate 7 in FIG. 1(G)).

<Second Interlayer Connection Step (d)>

Holes were individually bored on both sides of the second substrate using a carbon dioxide laser processing machine (trade name: LC-1C/21, manufactured by Hitachi Via Mechanics, Ltd.) under conditions with a beam irradiation diameter of Φ0.21 mm, a frequency of 500 Hz, and a pulse width of 10 μs to form non-through holes (non-through holes 6B in FIG. 1(H)) on both sides of the second substrate. Then, a desmear treatment was carried out using an aqueous solution of sodium permanganate at a temperature of 80±5° C. and a concentration of 55±10 g/L.

Furthermore, a plating treatment to a thickness of 0.4 to 0.8 μm was carried out by electroless copper plating, and then plating to a thickness of 8 μm was carried out by electrolytic copper plating, thereby forming a copper plating film (copper plating film 9A in FIG. 1(I)). As a result, the second and third metal layers were electrically connected by the non-through holes via the copper plating film.

<Peeling Step (e)>

The second substrate was separated by applying a physical force to the boundary portion between the copper foil with a peeling layer (first metal layer 3) and the prepreg (core resin layer 2), thereby obtaining a third substrate (third substrate 10 in FIG. 1(K)).

<Wiring Conductor Forming Step (f)>

After forming guide holes in the third substrate using a router processing machine manufactured by Hitachi Via Mechanics, Ltd., the surface was etched with a hydrogen peroxide/sulfuric acid-based soft etching solution by about 1 to 2 μm, and then a dry film resist (trade name: NIT225, manufactured by Nichigo-Morton Co., Ltd.) was laminated at a temperature of 110±10° C. and a pressure of 0.50±0.02 MPa. After carrying out printing of a circuit pattern with a parallel exposure machine based on the guide holes, the dry film resist was developed with an aqueous solution of 1% sodium carbonate, and pattern electrolytic copper plating was carried out for about 15 to 20 μm with a copper sulfate plating line with a copper sulfate concentration of 60 to 80 g/L and a sulfuric acid concentration of 150 to 200 g/L. Thereafter, the dry film resist was peeled off and removed with an amine-based resist peeling solution to form a pattern on the third metal layer, thereby fabricating a package substrate for loading a semiconductor device (package substrate for loading a semiconductor device 13 in which a wiring conductor 12 is formed on both sides of the insulating layer 11 in FIG. 1(L)).

The obtained package substrate for loading a semiconductor device was subjected to a solder resist forming treatment and a gold plating finish, and then, by subjecting it to cutting processing to the package size, a package substrate for loading a semiconductor device of Example 1 was obtained. The package substrate for loading a semiconductor device of Example 1 had excellent handling properties, and when it was fabricated multiple times, the yield was 99%.

Example 2

A package substrate for loading a semiconductor device of Example 2 was obtained in the same manner as in Example 1, except that, in the first substrate forming step (a), the first substrate (circuit-forming substrate (first substrate) 1 in FIG. 1(B)) was fabricated according to the following.

On both sides of a B stage prepreg (core resin layer 2 in FIG. 1(A); thickness 0.08 mm; trade name: GHPL-830NS SH65, manufactured by Mitsubishi Gas Chemical Company) obtained by impregnating a glass cloth (glass fiber) with a bismaleimide triazine resin (BT resin), a copper foil with a peeling layer (first metal layer 3 in FIG. 1(A), trade name: PCS, manufactured by JX Nippon Mining & Metals Corporation, surface roughness Rz 3.7 μm) obtained by coating a release layer on a 8 μm-thick copper foil was arranged such that the peeling layer surface adhered to the prepreg. Further onto that, via a B stage prepreg (first insulating resin layer 4 in FIG. 1(A); thickness 0.017 mm; trade name: GHPL-830NS SF62, manufactured by Mitsubishi Gas Chemical Company) obtained by impregnating a glass cloth (glass fiber) with a bismaleimide triazine resin (BT resin), a 2 μm copper foil with an 18 μm carrier copper foil (second metal layer 5 in FIG. 1(A); trade name: MTEx, manufactured by Mitsui Mining & Smelting Co., Ltd.) was laminated by vacuum pressing under conditions with a pressure of 2.5±0.2 MPa, a temperature of 220±2° C., and a holding time of 60 minutes. Then, the 18 μm carrier copper foil was peeled off, thereby fabricating a second circuit substrate and fabricating a first substrate (circuit-forming substrate (first substrate) 1 in FIG. 1(B)).

The package substrate for loading a semiconductor device of Example 2 had excellent handling properties, and when it was fabricated multiple times, the yield was 99%.

Comparative Example 1

A copper foil (trade name: PCS, manufactured by JX Nippon Mining & Metals Corporation) obtained by coating a release layer on a 2 μm-thick copper foil was arranged on both sides of a B stage prepreg (core resin layer; thickness 0.100 mm; trade name: GHPL-830NS ST56, manufactured by Mitsubishi Gas Chemical Company) obtained by impregnating a glass cloth (glass fiber) with a bismaleimide triazine resin (BT resin) such that the peeling layer surface adhered to the prepreg. Then, vacuum pressing was carried out under conditions with a temperature of 220±2° C., a pressure of 5±0.2 MPa, and a holding time of 60 minutes, thereby fabricating a copper-clad laminate with a surface roughness of 3 μm copper foil.

On both sides of the obtained copper-clad laminate, via a B stage prepreg (thickness 0.017 mm; trade name: GHPL-830NS SF62, manufactured by Mitsubishi Gas Chemical Company) obtained by impregnating a glass cloth (glass fiber) with a bismaleimide triazine resin (BT resin), a 12 μm copper foil (trade name: 3LC-VLP, manufactured by Mitsui Mining & Smelting Co., Ltd.) was laminated by vacuum pressing under conditions with a pressure of 2.5±0.2 MPa, a temperature of 220±2° C., and a holding time of 60 minutes.

Next, a surface conditioning treatment was carried out for the surface of the obtained substrate, and a dry film resist (trade name: NIT225, manufactured by Nichigo-Morton Co., Ltd.) was laminated at a temperature of 110±10° C. and a pressure of 0.50±0.02 MPa. Thereafter, a negative mask was attached thereon, a circuit pattern was then printed with a parallel exposure machine, the dry film resist was developed with an aqueous solution of 1% sodium carbonate to form an etching resist, and the copper in the portion without the etching resist was removed with an aqueous solution of ferric chloride. Then, the dry film resist was removed with an aqueous solution of sodium hydroxide to form a circuit pattern.

The surface of the obtained substrate was roughened using a copper surface roughening solution (product name: CZ-8100, manufactured by MEC Company Ltd.), and a B stage resin sheet (thickness 0.010 mm; trade name: CRS-381NSI, manufactured by Mitsubishi Gas Chemical Company) obtained by coating a 2 μm copper foil with an 18 μm carrier copper foil (trade name: MTEx, manufactured by Mitsui Mining & Smelting Co., Ltd.) with a bismaleimide triazine resin (BT resin) was laminated on both sides of the substrate by carrying out vacuum pressing under conditions with a pressure of 2.5±0.2 MPa, a temperature of 220±2° C., and a holding time of 60 minutes. Then, the 18 μm carrier copper foil was peeled off.

The obtained substrate was separated by applying a physical force to the boundary portion between the core resin layer and the PCS.

An attempt was made to bore holes individually on both sides of the substrate peeled off from the core resin layer, using a carbon dioxide laser processing machine (trade name: LC-1C/21, manufactured by Hitachi Via Mechanics, Ltd.) under conditions with a beam irradiation diameter of Φ0.21 mm, a frequency of 500 Hz, and a pulse width of 10 μs, thereby forming non-through holes on the substrate, but because the substrate was very thin, the substrate was damaged.

The disclosure of Japanese Patent Application No. 2018-234584 filed on Dec. 14, 2018, is incorporated herein by reference in its entirety.

All reference documents, patent applications, and technical standards described in the specification are incorporated by reference herein to the same extent as if each of those reference documents, patent applications, and technical standards was specifically and individually described as being incorporated by reference.

REFERENCE SIGNS LIST 1 circuit-forming substrate (first substrate)
2 core resin layer
3 first metal layer
44 first insulating resin layer
5 second metal layer
5A and 9A copper plating film
6A and 6B non-through hole
7 second substrate
8 second insulating resin layer
9 third metal layer
10 third substrate
11 insulating layer
12 wiring conductor
13 package substrate for loading a semiconductor device

The invention claimed is:

1. A method for manufacturing a package substrate for mounting a semiconductor device comprising an insulating layer and a wiring conductor provided on the insulating layer, the method comprising:
forming a first substrate comprising a first metal layer that has a thickness of 1 μm to 70 μm and that is peelable from a core resin layer, a first insulating resin layer, and a second metal layer in this order on one side or both sides of the core resin layer,
wherein the forming of the first substrate is performed by forming a first laminate in which the first metal layer, the first insulating resin layer, and the second metal layer are arranged in this order on both sides of the core resin layer, and heating and pressurizing the first laminate all at once to form the first substrate, and
wherein the core resin layer has a film thickness of 1 μm to 90 μm;
forming a non-through hole reaching a surface of the first metal layer on a surface of the first substrate, carrying out electrolytic copper plating and/or electroless copper plating on an inner wall of the non-through hole, and connecting the second metal layer and the first metal layer;
forming a second substrate by heating and pressurizing a second laminate formed by arranging a second insulating resin layer and a third metal layer in this order on a surface of the second metal layer of the first substrate;
forming a second non-through hole reaching the surface of the second metal layer on a surface of the second substrate, carrying out electrolytic copper plating and/or electroless copper plating on an inner wall of the second non-through hole, and connecting the second metal layer and the third metal layer;
peeling off, from the core resin layer, a third substrate comprising the first metal layer, the first insulating resin layer, the second metal layer, the second insulating resin layer, and the third metal layer in this order; and
patterning the first metal layer and the third metal layer of the third substrate to form the wiring conductor.

2. The method for manufacturing the package substrate for mounting the semiconductor device according to claim 1, wherein the third substrate has a thickness of 5 μm to 100 μm.

3. The method for manufacturing the package substrate for mounting the semiconductor device according to claim 1, wherein the first metal layer comprises a peeling layer, and in the first substrate, the first metal layer is arranged such that the peeling layer and the core resin layer are in contact with each other.

4. The method for manufacturing the package substrate for mounting the semiconductor device according to claim 1, wherein the third metal layer comprises a carrier layer, and the carrier layer is removed from the third metal layer after the first substrate is heated and pressurized during the forming of the second substrate.

5. The method for manufacturing the package substrate for mounting the semiconductor device according to claim 1, wherein at least any one of the first metal layer, the second metal layer, and the third metal layer is a copper foil.

6. The method for manufacturing the package substrate for mounting the semiconductor device according to claim 1, wherein at least any one of the core resin layer, the first insulating resin layer, and the second insulating resin layer is a prepreg obtained by impregnating a base material with a resin.

* * * * *